United States Patent
Mansour

(10) Patent No.: US 8,156,413 B2
(45) Date of Patent: Apr. 10, 2012

(54) CONVOLUTIONAL ENCODING WITH PARTITIONED PARALLEL ENCODING OPERATIONS

(75) Inventor: Mohamad Mansour, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 806 days.

(21) Appl. No.: 12/323,365

(22) Filed: Nov. 25, 2008

(65) Prior Publication Data

US 2009/0144604 A1 Jun. 4, 2009

Related U.S. Application Data

(60) Provisional application No. 60/990,722, filed on Nov. 28, 2007.

(51) Int. Cl.
*H03M 13/03* (2006.01)
(52) U.S. Cl. .................................. 714/789
(58) Field of Classification Search .............. 714/789
See application file for complete search history.

(56) References Cited

U.S. PATENT DOCUMENTS

| | | | | |
|---|---|---|---|---|
| 4,575,770 A * | 3/1986 | Dieterich | ...... | 386/268 |
| 4,939,734 A * | 7/1990 | Heichler | ...... | 714/790 |
| 6,707,806 B1 * | 3/2004 | Kato | ...... | 370/336 |
| 6,810,499 B2 * | 10/2004 | Sridharan et al. | ...... | 714/755 |
| 6,940,928 B2 * | 9/2005 | Cameron | ...... | 375/341 |

FOREIGN PATENT DOCUMENTS

WO WO03052997 6/2003

OTHER PUBLICATIONS

Msir, A. et al: "Design of a high speed parallel encoder for convolutional codes" Microelectronics Journal 35 (2004) 151-166, XP002522779.

* cited by examiner

*Primary Examiner* — Joseph D Torres
(74) *Attorney, Agent, or Firm* — Stanton Braden

(57) ABSTRACT

Convolutional encoding throughput is increased by partitioning input information bits into a plurality of blocks that are convolutionally encoded in parallel. A plurality of convolutional encoding operations which have respective initial encode states that are mutually different from one another are applied in parallel to one of the blocks to produce a respectively corresponding plurality of convolutional encoding results. One of the convolutional encoding results is selected based on a convolutional encoding operation applied to another of the blocks.

20 Claims, 4 Drawing Sheets

CONVOLUTIONAL ENCODING WITH PARTITIONED PARALLEL ENCODING OPERATIONS

CLAIM OF PRIORITY UNDER 35 U.S.C. §119

The present application for patent claims priority to Provisional Application No. 60/990,722 entitled "Method and Apparatus for a Parallel Encode-Select Convolutional Encoder" filed Nov. 28, 2007, and assigned to the assignee hereof and hereby expressly incorporated by reference herein.

BACKGROUND

1. Field

The present disclosure relates generally to communications and, more particularly, to communications that use convolutional coding.

2. Background

Convolutional encoders encode a packet (or other unit) of information bits serially by running a finite state machine (FSM) with information bits as inputs and coded bits as outputs. An example of a conventional convolutional encoder is shown at 11 in FIG. 1, having an input that receives the input information bits serially, three storage cells D that sequentially store each input bit for use in encode logic operations, and three outputs, coded bits $C_0$, $C_1$ and $C_2$. The encoding complexity is linear in the packet length L. This complexity becomes a performance bottleneck for high-speed applications that require high encoding throughput for long packets.

Existing solutions apply look-ahead techniques that unroll the state machine n steps in time by providing logic that, for every input bit, produces the corresponding coded bits $C_0$-$C_2$ as a function of only the input bits and the initial encode state (i.e., the values initially stored in the storage cells D of FIG. 1). These look-ahead techniques can speed up performance by a factor of n, as indicated by comparing FIGS. 1 and 2. In the encoder of FIG. 1, n clock cycles are required to encode a sequence of n input bits. In contrast, in the look-ahead encoder 21 of FIG. 2, all n input bits are received and encoded in parallel, so all 3n coded bits associated with the n input bits are produced in a single clock cycle. However, for large n, the logic complexity and critical path of a look-ahead encoder increase significantly, so the look ahead technique becomes impractical at some point as n (the degree of unrolling) increases.

It is desirable in view of the foregoing to provide for another approach to increasing encoding throughput in convolutional encoders.

SUMMARY

According to exemplary embodiments of the present work, convolutional encoding throughput is increased by partitioning input information bits into a plurality of blocks that are convolutionally encoded in parallel. A plurality of convolutional encoding operations which have respective initial encode states that are mutually different from one another are applied in parallel to one of the blocks to produce a respectively corresponding plurality of convolutional encoding results. One of the convolutional encoding results is selected based on a convolutional encoding operation applied to another of the blocks.

BRIEF DESCRIPTION OF THE DRAWINGS

Various aspects of a wireless communications system are illustrated by way of example, and not by way of limitation, in the accompanying drawings, wherein.

DETAILED DESCRIPTION

The detailed description set forth below in connection with the appended drawings is intended as a description of various embodiments of the present work and is not intended to represent the only embodiments in which the present work may be practiced. The detailed description includes specific details for the purpose of providing a thorough understanding of the present work. However, it will be apparent to those skilled in the art that the present work may be practiced without these specific details. In some instances, well known structures and components are shown in block diagram form in order to avoid obscuring the concepts of the present work.

The word "exemplary" is used herein to mean "serving as an example, instance, or illustration." Any embodiment described herein as "exemplary" is not necessarily to be construed as preferred or advantageous over other embodiments.

The present work employs a further dimension for parallelism. In some embodiments, a packet of bit length L is divided into m smaller blocks, referred to herein as blocks 1-m, each block having size L/m. Each block is encoded independently, and then the encoded bits are combined together to form the final coded bits. For this to be possible, each of the m blocks must be encoded by an encoder that is initialized with an appropriate initial encode state. For convolutional codes with short constraint lengths, the number of possible initial encode states v is relatively small (e.g. for 3GPP2/UMB and 3GPP/LTE v=8). Hence, it is possible to encode each of the m blocks for every possible initial encode state. For i=2 to m, block i is encoded for every possible initial encode state, and then the correct set of output coded bits is selected based on the final encode state reached by the encoding that was selected for block i−1. The initial encode state, which is used by a first encoder for encoding block 1, is known. Each of the remaining m−1 encoders is a composite encoder that contains v constituent copies of a desired encoder design. Each of the constituent copies is initialized with one of the v possible states. For i=2 to m, the final coded bit outputs for encoder i are selected depending on the final encode state reached by encoder (i−1). The encoding throughput is increased by a factor of L/m.

Figure 3:
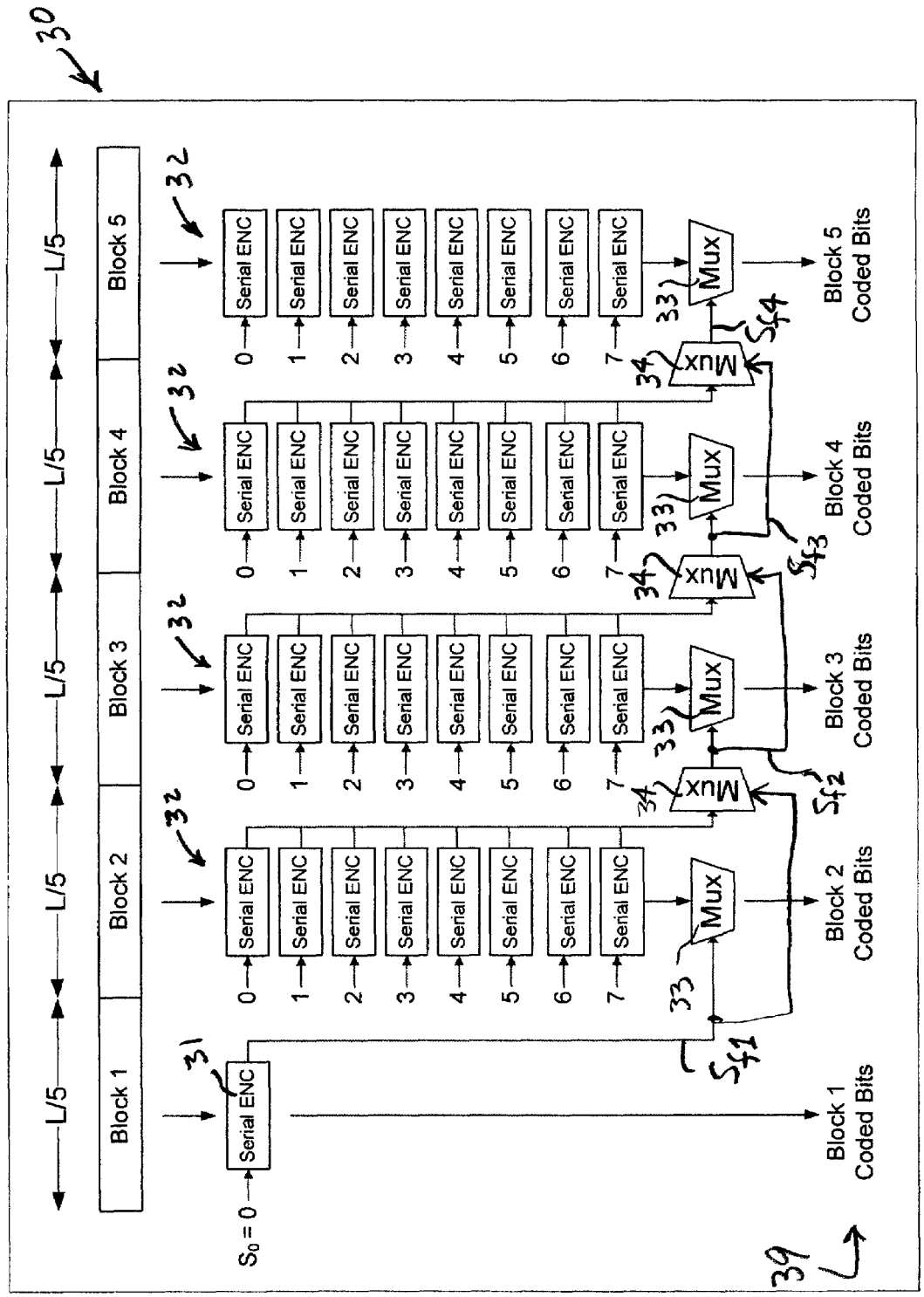
FIG. 3 diagrammatically illustrates the structure and operation of a convolutional encoding apparatus according to exemplary embodiments of the present work.

FIG. 3 diagrammatically illustrates a convolutional encoding apparatus 30 according to exemplary embodiments of the present work. The apparatus 30 includes an initial state convolutional encoder 31 and a plurality of composite convolutional encoders 32. Each composite encoder 32 contains a plurality of constituent convolutional encoders (eight constituent encoders in the example of FIG. 3) designated at 0-7.

Figure 1:
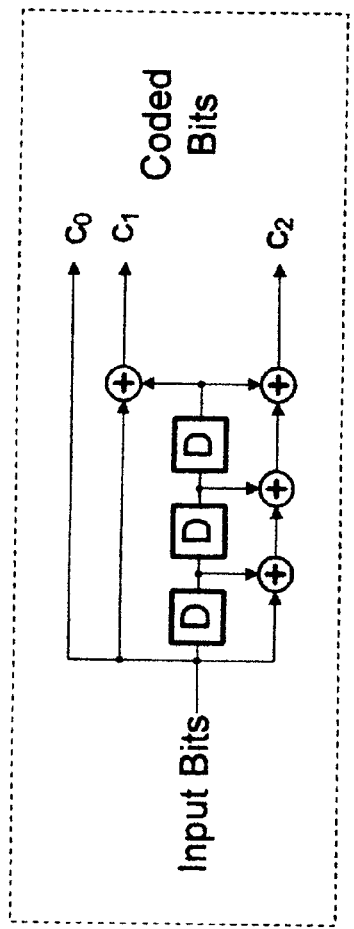
FIG. 1 diagrammatically illustrates a prior art serial convolutional encoder.

In some embodiments, the serial convolutional encoder design shown at 11 in FIG. 1 is used as the initial state encoder 31 and the constituent encoders 0-7. Various embodiments use various serial convolutional encoder designs as encoders 31 and 0-7. The initial state encoder 31 and each of the composite encoders 32 apply serial convolutional encoding to respectively corresponding blocks of information bits within a packet or other unit of L input information bits. The example of FIG. 3 shows that the L input bits are partitioned (divided) into five blocks (i.e., m=5) designated as Block 1-Block 5, each consisting of L/5 bits. This partitioning of the input bits permits the L/5-bit blocks to be encoded in parallel with one another using five respectively corresponding parallel encoding paths, as described in detail below.

Operation of the convolutional encoding apparatus 30 of FIG. 3 is described herein (for purposes of exemplary exposition only) for embodiments that utilize at 31 and 0-7 the serial convolutional encoder design 11 of FIG. 1 (designated by Serial ENC in FIG. 3). The initial state encoder 31 is configured with an initial encode state $S_0$. The constituent encoders 0-7 are respectively configured with the eight possible initial encode states associated with the encoder design 11 of FIG. 1 (i.e., the eight possible combinations of 1's and 0's stored in the three storage cells D). Encoder 31 applies its associated serial convolutional encoding operation to Block 1, producing its output, designated as Block 1 Coded Bits, in L/5 clock cycles. As shown in FIG. 3, the Block 1 Coded Bits form a constituent component of the output coded bits 39 that result when the L input information bits are encoded by the encoding apparatus 30 of FIG. 3.

Within each composite encoder 32, all of the constituent encoders 0-7 receive the associated block (i.e., one of Block 2-Block 5) of input information bits. The constituent encoders 0-7 within each composite encoder 32 operate on the associated block in parallel to apply their respective serial convolutional encoding operations to the block. Each of the constituent encoders 0-7 produces its associated set of output coded bits in L/5 clock cycles. All of the encoders 31 and 32 operate in parallel, so all output coded bits necessary to produce the output coded bits 39 are produced in L/5 clock cycles.

For each composite encoder 32, the output coded bits from all constituent encoders 0-7 are input to a respectively associated selector 33. In some embodiments the selectors 33 include multiplexers (MUXes) as shown in FIG. 3. Each selector 33 selects one of the outputs of its associated constituent encoders 0-7 in accordance with the final encoding state of the encoder that was selected to encode the block that immediately precedes the block associated with the selector 33. Thus, the selector 33 associated with Block 2 makes its selection in accordance with the final encode state $S_{f1}$ associated with the encoder that encodes Block 1. For example, if $S_{f1}=7$, i.e., all storage cells D (see also FIG. 1) of the initial state encoder 31 contain a 1, then the selector 33 for Block 2 selects the output of constituent encoder 7 (whose initial encode state has all storage cells D containing a 1) to provide the Block 2 Coded Bits at 39.

The final encode state $S_{f1}$ also controls operation of a further selector 34 associated with Block 2, which receives as inputs the final encode states of all constituent encoders 0-7 of Block 2. The output of the selector 34 associated with Block 2 provides $S_{f2}$, the final encode state of the one of constituent encoders 0-7 whose output is selected (by the associated selector 33 under control of $S_{f1}$) to provide the Block 2 Coded Bits at 39. The output $S_{f2}$ controls the selections made by selectors 33 and 34 for Block 3, and the analogous output $S_{f3}$ associated with Block 4 controls the selections made by the selectors 33 and 34 for Block 5. In this fashion, the appropriate one of the constituent encoders 0-7 can be selected for each of Block 2-Block 5, with the output coded bits 39 produced in L/5 clock cycles, as compared to the L clock cycles that are required to produce the same result using the serial convolutional encoding of the prior art encoder 11 of FIG. 1.

Figure 2:
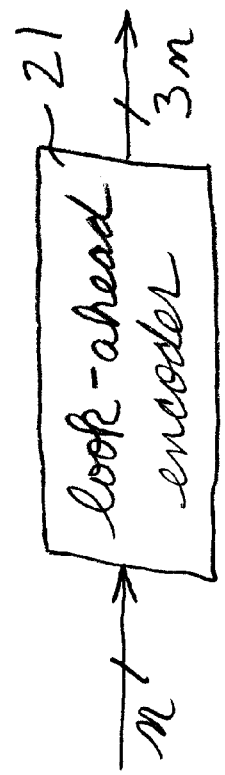
FIG. 2 diagrammatically illustrates a prior art convolutional encoder that employs look-ahead techniques.
Figure 4:
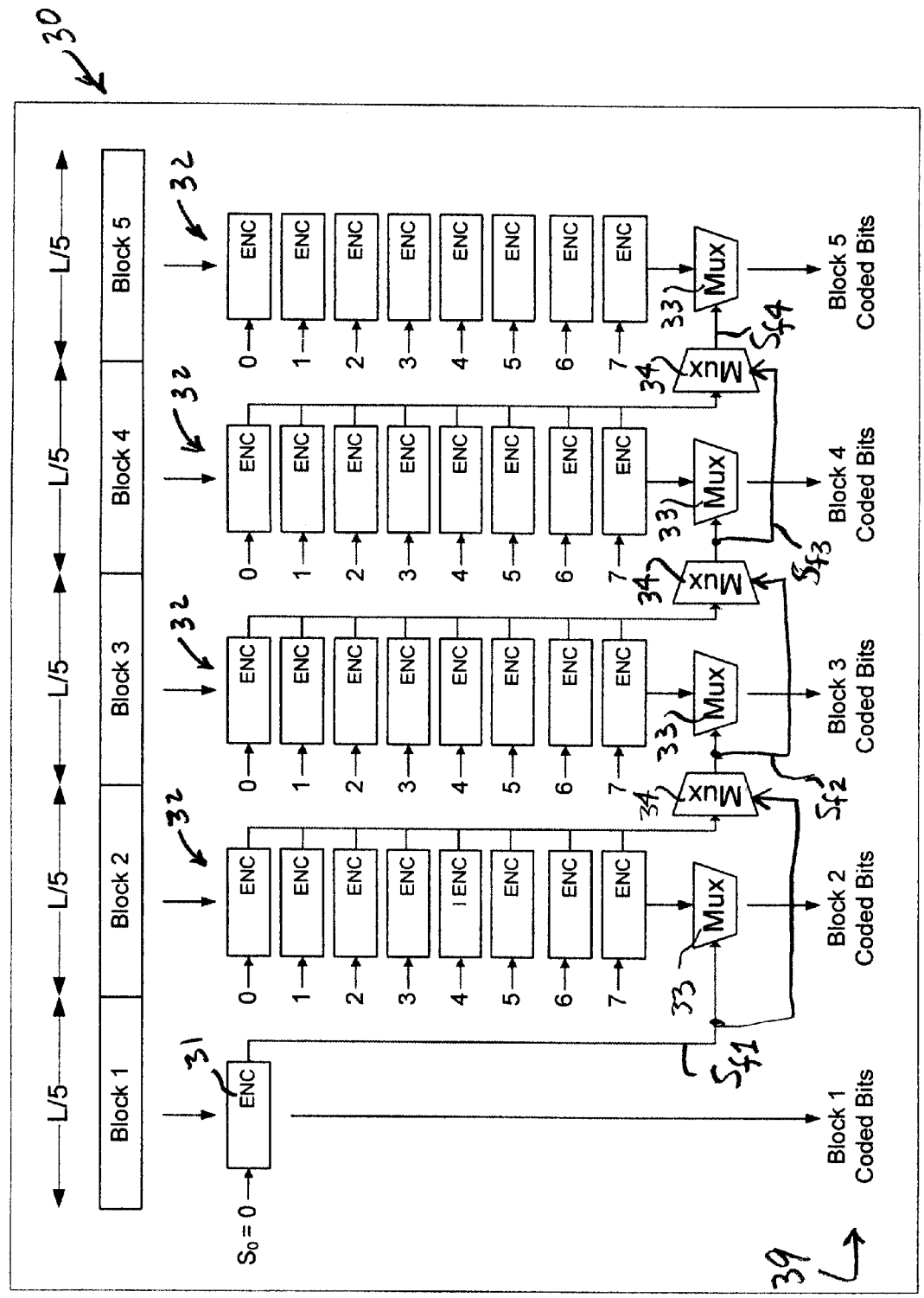
FIG. 4 diagrammatically illustrates the structure and operation of a convolutional encoding apparatus according to exemplary embodiments of the present work.

Some embodiments use a prior art look-ahead encoding technique (such as described above with respect to FIG. 2) within a parallel encoding arrangement such as described above with respect to FIG. 3. An example of this is shown generally in FIG. 4, wherein each of the serial convolutional encoders (Serial ENC) 31 and 0-7 from FIG. 3 is replaced by a look-ahead encoder (designated by ENC in FIG. 4), for example the look-ahead encoder 21 of FIG. 2, with n=L/5. Thus, in the convolutional encoding apparatus of FIG. 4, each of the encoders 31 and 0-7 encodes all L/5 bits of its associated block in a single clock cycle, making the output coded bits 39 available in a single clock cycle.

Figure 5:
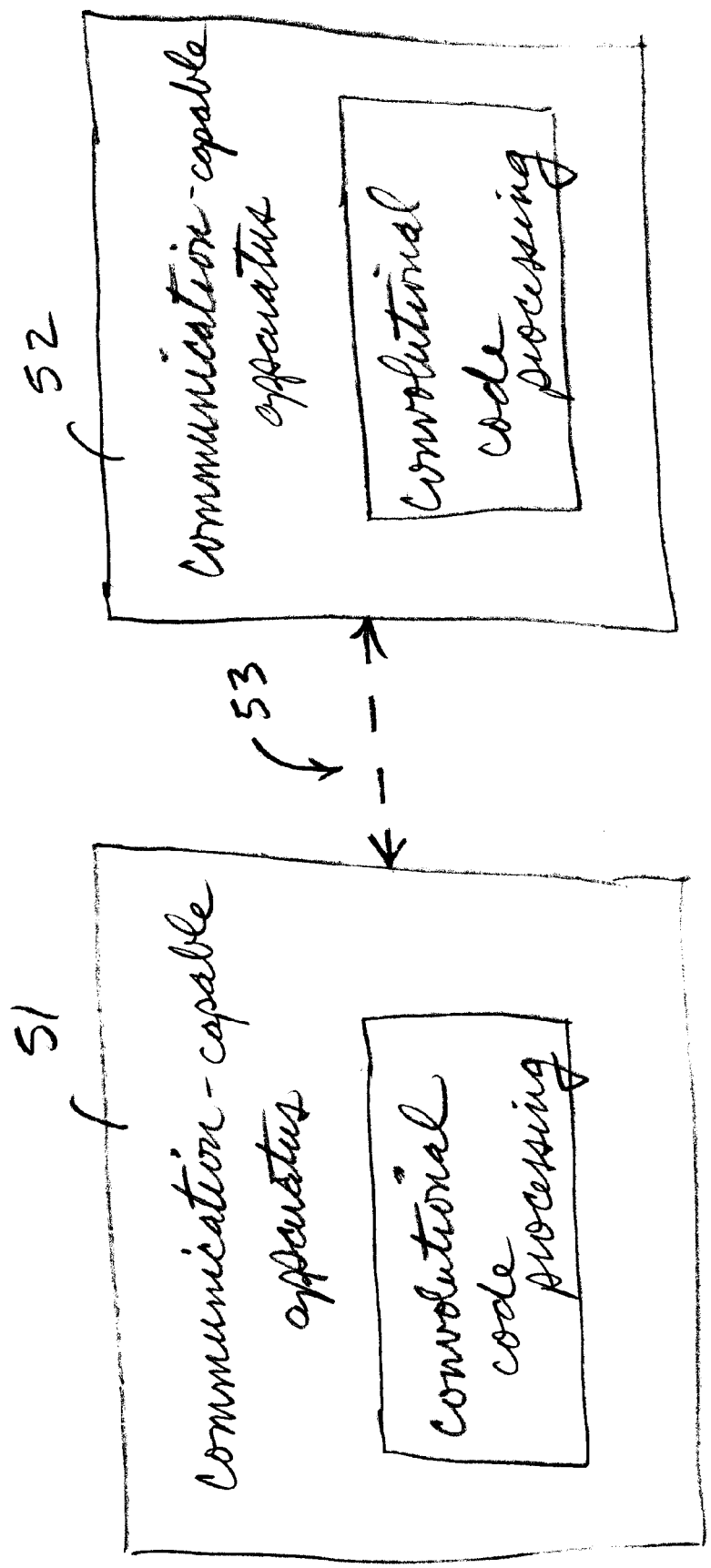
FIG. 5 diagrammatically illustrates a communication system according to exemplary embodiments of the present work.

FIG. 5 diagrammatically illustrates a communication system according to exemplary embodiments of the present work. In FIG. 5, information to be communicated from communication-capable apparatus 51 to communication-capable apparatus 52 via communication channel 53, or vice versa, can be convolutionally encoded in any of the exemplary manners described above. In various embodiments, one or both apparatus 51 and apparatus 52 includes convolutional coding facilities suitable for implementing convolutional encoding in the exemplary manners described above. In some embodiments, one of apparatus 51 and apparatus 52 is a communication transmitter that performs convolutional encoding according to the present work, and the other of apparatus 51 and apparatus 52 is a communication receiver. In some embodiments, both apparatus 51 and apparatus 52 are communication transceivers. both of which perform convolutional encoding according to the present work as part of their respective transmit functionalities. In some embodiments, apparatus 51 is a fixed site apparatus and apparatus 52 is a fixed site apparatus. In some embodiments, one of apparatus 51 and apparatus 52 is a portable or mobile apparatus, and the other is a fixed site apparatus. In some embodiments, apparatus 51 is a portable or mobile apparatus and apparatus 52 is a portable or mobile apparatus. In some embodiments, the communication channel 53 includes a wired channel. In some embodiments, the communication channel 53 includes a wireless channel. In some embodiments, the communication channel 53 includes both a wired channel and a wireless channel.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present work.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use products that embody principles of the present work. Various modifications to these embodiments will be readily apparent to those skilled in the art, and the generic principles defined herein may be applied to other embodiments without departing from the spirit or scope of the disclosure. Thus, the present work is not intended to be limited to the embodiments shown herein but is to be accorded the widest scope consistent with the principles and novel features disclosed herein.

What is claimed is:

1. An apparatus for applying a desired convolutional encoding operation to an input plurality of information bits, comprising:
   a plurality of convolutional encoders that receive respectively corresponding blocks of said information bits, each of said convolutional encoders configured to apply at least one convolutional encoding operation to the associated block of information bits such that convolutional encoding is applied to all of said blocks in parallel, one of said convolutional encoders configured to apply in parallel to the associated block of information bits a plurality of convolutional encoding operations having respective initial encode states that are mutually different from one another; and
   a selector coupled to said one convolutional encoder, said selector receiving in parallel from said one convolutional encoder a plurality of convolutional encoding operation results respectively produced by the parallel convolutional encoding operations performed by said one convolutional encoder, said selector receiving a selection control signal indicative of a convolutional encoding operation performed by another of said convolutional encoders.

2. The apparatus of claim 1, wherein said selection control signal is indicative of a final encode state associated with said convolutional encoding operation performed by said another convolutional encoder.

3. The apparatus of claim 1, including a further selector coupled to said another convolutional encoder and said first-mentioned selector for providing said selection control signal to said first-mentioned selector.

4. The apparatus of claim 1, wherein said selector includes an output that provides a constituent component of an encoded plurality of bits that results from said desired convolutional encoding operation.

5. The apparatus of claim 4, wherein said plurality of input information bits consists of a first number of said information bits and a second number of said blocks, wherein said second number is less than said first number, and wherein a number of clock cycles of said apparatus required to produce said encoded plurality of bits from said input plurality of information bits is equal to said first number divided by said second number.

6. The apparatus of claim 4, wherein only one clock cycle of said apparatus is required to produce said encoded plurality of bits from said input plurality of information bits.

7. The apparatus of claim 1, wherein said one convolutional encoder applies each of said parallel convolutional encoding operations to all information bits of the associated block in parallel.

8. The apparatus of claim 7, wherein said one convolutional encoder is configured such that each of said parallel convolutional encoding operations implements a look-ahead encoding technique.

9. A method for applying a desired convolutional encoding operation to an input plurality of information bits, comprising:
   partitioning said information bits into a plurality of blocks of information bits;
   applying at least one convolutional encoding operation to each of said blocks of information bits in parallel, including applying in parallel to one of said blocks a plurality of convolutional encoding operations which have respective initial encode states that are mutually different from one another, and which produce a respectively corresponding plurality of convolutional encoding results; and
   selecting one of said convolutional encoding results based on a convolutional encoding operation applied to another of said blocks.

10. The method of claim 9, wherein said selecting includes selecting said one convolutional encoding result based on a final encode state associated with said convolutional encoding operation applied to said another block.

11. The method of claim 9, wherein said one convolutional encoding operation result provides a constituent component of an encoded plurality of bits that results from said desired convolutional encoding operation.

12. The method of claim 9, wherein said last-mentioned applying includes, for each of said parallel convolutional encoding operations, applying said convolutional encoding operation to all information bits of said one block in parallel.

13. An apparatus for applying a desired convolutional encoding operation to an input plurality of information bits, comprising:
   means for partitioning said information bits into a plurality of blocks of information bits;

means for applying at least one convolutional encoding operation to each of said blocks of information bits in parallel, including means for applying in parallel to one of said blocks a plurality of convolutional encoding operations which have respective initial encode states that are mutually different from one another, and which produce a respectively corresponding plurality of convolutional encoding results; and means for selecting one of said convolutional encoding results based on a convolutional encoding operation applied to another of said blocks.

14. The apparatus of claim 13, wherein said means for selecting includes means for selecting said one convolutional encoding result based on a final encode state associated with said convolutional encoding operation applied to said another block.

15. The apparatus of claim 13, wherein said one convolutional encoding operation result provides a constituent component of an encoded plurality of bits that results from said desired convolutional encoding operation.

16. The apparatus of claim 13, wherein said last-mentioned applying means includes, for each of said parallel convolutional encoding operations, means for applying said convolutional encoding operation to all information bits of said one block in parallel.

17. A computer program product for applying a desired convolutional encoding operation to an input plurality of information bits, comprising:

a computer-readable medium comprising:

code for causing at least one data processor to partition said information bits into a plurality of blocks of information bits;

code for causing the at least one data processor to apply at least one convolutional encoding operation to each of said blocks of information bits in parallel, including applying in parallel to one of said blocks a plurality of convolutional encoding operations which have respective initial encode states that are mutually different from one another, and which produce a respectively corresponding plurality of convolutional encoding results; and code for causing the at least one data processor to select one of said convolutional encoding results based on a convolutional encoding operation applied to another of said blocks.

18. The computer program product of claim 17, wherein said code for causing the at least one data processor to select causes the at least one data processor to select said one convolutional encoding result based on a final encode state associated with said convolutional encoding operation applied to said another block.

19. The computer program product of claim 17, wherein said one convolutional encoding operation result provides a constituent component of an encoded plurality of bits that results from said desired convolutional encoding operation.

20. The computer program product of claim 17, wherein said applying in parallel includes, for each of said parallel convolutional encoding operations, applying said convolutional encoding operation to all information bits of said one block in parallel.

* * * * *